United States Patent [19]

Müller et al.

[11] Patent Number: 4,605,567
[45] Date of Patent: Aug. 12, 1986

[54] CROSSLINKABLE ORGANOPOLYSILOXANES AND A METHOD FOR PREPARING THE CROSSLINKABLE ORGANOPOLYSILOXANES

[75] Inventors: Johann Müller; Christa Trieschmann; Gerhard Preiner, all of Burghausen, Fed. Rep. of Germany

[73] Assignee: Wacker-Chemie GmbH, Munich, Fed. Rep. of Germany

[21] Appl. No.: 781,168

[22] Filed: Sep. 30, 1985

[30] Foreign Application Priority Data

Dec. 27, 1984 [DE] Fed. Rep. of Germany ....... 3447457

[51] Int. Cl.$^4$ .............................................. B05D 3/06
[52] U.S. Cl. ...................... 427/54.1; 427/35; 427/36; 522/99; 528/24; 528/32; 556/438; 556/439
[58] Field of Search ...................... 522/99; 528/32, 24; 556/438, 439; 427/54.1, 36, 35

[56] References Cited

U.S. PATENT DOCUMENTS 4,019,904  4/1977  Noshiro et al. ..................... 522/99
4,290,869  9/1981  Pigeon ................................ 528/17
4,563,514  1/1986  Liu et al. ............................ 528/32

Primary Examiner—Melvyn I. Marquis

[57] ABSTRACT

Organopolysiloxanes having the formulas $$A_xR_{3-x}SiO(SiR_{2-x}A_xO)_nSiR_{3-x}A_x$$

or $$(SiR_{2-x}A_xO)_y,$$

where R is a monovalent hydrocarbon radical or a halogenated monovalent hydrocarbon radical or a monovalent aliphatic radical consisting of carbon, hydrogen, ether oxygen and fluorine atoms; A is a SiC-bonded organic radical containing a carboxyl group and a carbonyl group to which is bonded an organic radical having at least one terminal carbon-carbon double bond; n is an integer having a value of at least 1; x is 0 or 1; and y is an integer having a value of from 3 to 10, in which the organopolysiloxanes contain at least one radical represented by A per molecule.

These organopolysiloxanes are preferably prepared by reacting organopolysiloxanes having the above formulas, in which the radical A is hydrogen, with, for example, allylsuccinic anhydride, and thereafter reacting the resultant organopolysiloxanes, which contain carboxylic acid anhydride groups, with, for example, a hydroxyethyl acrylate.

The organopolysiloxanes can be crosslinked, for example, by ultraviolet light, and may be used in the preparation of coatings or for embedding electronic components.

18 Claims, No Drawings

CROSSLINKABLE ORGANOPOLYSILOXANES AND A METHOD FOR PREPARING THE CROSSLINKABLE ORGANOPOLYSILOXANES

The present invention relates to crosslinkable organopolysiloxanes, particularly to organopolysiloxanes which are crosslinkable by radiation and more particularly to a method for preparing organopolysiloxanes which are crosslinked by radiation.

BACKGROUND OF THE INVENTION

Photopolymerizable organopolysiloxane compositions having SiC-bonded acryloxyalkyl groups or methacryloxyalkyl groups as well as mercaptoalkyl groups are described in U. S. Pat. No. 4,290,869 to Pigeon. This patent discloses in column 8, lines 36 to 38, that such compositions have a stability of approximately 48 hours in closed and nontransparent containers.

It is, therefore, an object of the present invention to provide crosslinkable organopolysiloxanes which can be stored in closed containers for at least 6 months with the exclusion of light, especially ultraviolet light and have a sufficiently low viscosity prior to crosslinking that they flow into a relatively narrow fissure. Another object of the present invention is to provide stable crosslinkable organopolysiloxanes that can be stored for long periods of time in the absence of light and can be dispensed as a one-component composition without the necessity of using metering devices such as employed with a two-component composition. Still another object of the present invention is to provide crosslinkable organopolysiloxanes which do not crosslink in the apparatus used in preparing the organopolysiloxanes when the apparatus is not being used, thereby reducing the expenses normally incurred in cleaning the apparatus after each operation. Still another object of the present invention is to provide organopolysiloxanes which crosslink rapidly when exposed to ultraviolet light or light having a wavelength of from 400 to 600 nm. A further object of the present invention is to provide organopolysiloxanes which crosslink rapidly even as a relatively thick section when exposed to ultraviolet light or light having a wavelength of from 400 to 600 nm. A still further object of the present invention is to provide organopolysiloxanes which crosslink when exposed to ultraviolet light even in the presence of atmospheric oxygen. A still further object of this invention is to provide organopolysiloxane coatings which adhere to the substrates on which they are applied.

SUMMARY OF THE INVENTION

The foregoing objects and others which will become apparent from the following description are accomplished in accordance with this invention, generally speaking, by providing crosslinkable organopolysiloxanes having the formula

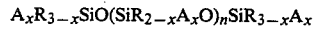

or

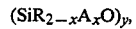

where R represents the same or different monovalent hydrocarbon radical or a halogenated monovalent hydrocarbon radical or a monovalent aliphatic radical containing carbon, hydrogen, ether oxygen and fluorine atoms; A represents the same or different SiC-bonded organic radical containing a carboxyl group and a carbonyl group, to which is bonded an organic radical having at least one terminal carbon-carbon double bond; n is an integer having a value of at least 1; x is 0 or 1; and y is an integer having a value of from 3 to 10, in which the organopolysiloxanes have at least one radical represented by A per molecule.

DESCRIPTION OF THE INVENTION

The organopolysiloxanes having the formula

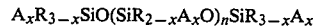

or

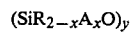

where A, R, n, x and y are the same as above, have a viscosity up to about 100,000 mPa.s at 25° C. and may be combined with a photosensitizer and/or an organic peroxide. The organopolysiloxane composition containing a photosensitizer and/or peroxide may be applied to various substrates and crosslinked by radiation.

Examples of hydrocarbon radicals represented by R are alkyl radicals having from 1 to 18 carbon atoms per radical, such as the methyl, ethyl, n-propyl, isopropyl, n-butyl and secbutyl radicals and octadecyl radicals; cycloalkyl radicals having from 5 to 8 carbon atoms per radical, such as the cyclohexyl and cycloheptyl radicals and methylcyclohexyl radicals; radicals such as the vinyl and allyl radicals which contain at least one aliphatic carbon-carbon double bond and from 2 to 18 carbon atoms per radical, in which the individual atoms comprising these radicals are carbon and hydrogen atoms; aryl radicals having from 6 to 12 carbon atoms per radical such as the phenyl radical and xenyl radicals; alkaryl radicals having from 7 to 18 carbon atoms per radical, such as the tolyl radicals; aralkyl radicals having from 7 to 18 carbon atoms per radical, such as the benzyl and α-phenylethyl radicals.

Examples of halogenated hydrocarbon radicals represented by R are the 3-chloropropyl radical and 3,3,3-trifluoropropyl radical and the o-, m- and p-chlorophenyl radicals.

Examples of monovalent aliphatic radicals represented by R which contain carbon, hydrogen, ether oxygen and fluorine atoms are the 1,1,2,2,3,3-hexafluoropropyloxypropyl radical and the 1,1,2,2-tetrafluoroethoxypropyl radical.

It is preferred that at least 80 percent of the number of radicals represented by R in the above formulas be methyl radicals because of their availability.

Preferably, the radicals represented by A have the following formulas

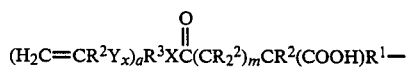

or

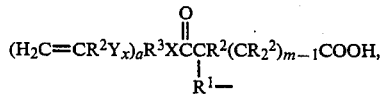

where $R^1$ represents the same or a different divalent hydrocarbon radical or halogenated divalent hydrocarbon radical; $R^2$ is hydrogen or a monovalent hydrocarbon radical which is free of aliphatic carbon-carbon multiple bonds and contains from 1 to 10 carbon atoms per radical; $R^3$ is a divalent hydrocarbon radical when a is 1, trivalent when a is 2 and tetravalent when a is 3; X is oxygen, sulfur or a radical having the formula $-NR^2-$, where $R^2$ is the same as above; Y is a group having the formula

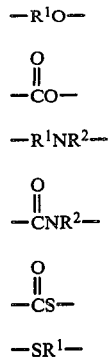

where $R^1$ and $R^2$ are the same as above; a is 1, 2 or 3; m is an integer having a value of from 1 to 6; and x is 0 or 1.

In the above formulas, X preferably represents oxygen, Y is preferably the $-(C=O)O-$ group and x, the subscript for Y, is preferably 1 and y is preferably 3 or 4.

Examples of radicals represented by $R^1$ are radicals having the formulas $-CH_2-$, $-(CH_2)_2-$, $(CH_2)_3-$, $-CH_2C(CH_3)HCH_2-$ and o—, m—and p—$CH_2CH_2C_6H_4-$ where the aryl radical can be halogenated. Preferably, however, $R^1$ represents linear divalent aliphatic radicals which are free of aliphatic carbon-carbon double bonds, and more preferably $R^1$ represents the radical having the formula $-(CH_2)_3-$.

Preferably $R^2$ is hydrogen and when two $R^2$ radicals are bonded to a carbon atom, then it is preferred that at least one $R^2$ be hydrogen. When $R^2$ is a hydrocarbon radical, then the methyl radical is the preferred hydrocarbon radical.

The $R^3$ radicals can be linear or branched. Examples of divalent radicals represented by $R^3$ are the radicals specified above as examples for radicals $R^1$ which do not contain halogen. Examples of other $R^3$ radicals are those having the formulas

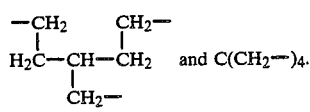

Particularly preferred as radicals representing A are those of the formulas

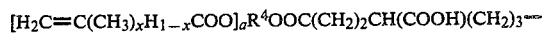

or

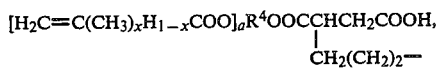

where x and a are the same as above and $R^4$, depending on the value of a, has the formula

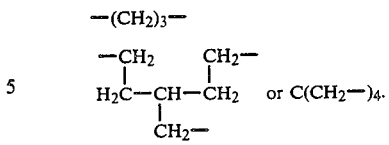

Preferably, however, a is 1 and x, the subscript for $CH_3$, is preferably 0.

The radical A can be present in every siloxane unit of the organopolysiloxanes of this invention; however, it is preferred that one radical A be present in the linear organopolysiloxanes, and at most in only about 10 mol percent of the siloxane units of such organopolysiloxanes.

The organopolysiloxanes of this invention preferably have a viscosity of from about 10 to 100,000 mPa.s at 25° C. and more preferably from about 100 to 20,000 mPa.s at 25° C.

Examples of organopolysiloxanes included in the formula:

$$A_xR_{3-x}SiO(SiR_{2-x}A_xO)_nSiR_{3-x}A_x$$

are those having the formulas

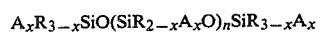

or

or mixtures of at least two different types of such organopolysiloxanes, where R, A and n are the same as above; f is 0 or an integer having a maximum value of n; and g is 1 or a number having a value of n−1.

The crosslinkable organopolysiloxanes of this invention may be prepared by reacting in a first stage an organopolysiloxane having the formula

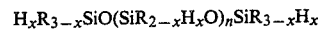

or

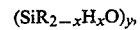

where R and x are the same as above, with a dicarboxylic acid anhydride having the formula

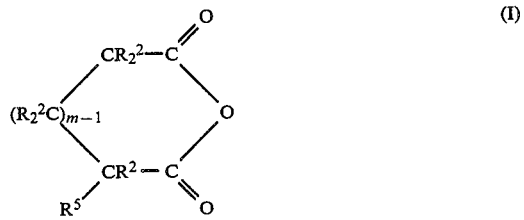

(I)

where $R^2$ and m are the same as above and $R^5$ is a monovalent hydrocarbon radical containing an aliphatic carbon-carbon double bond or a halogenated monovalent hydrocarbon radical containing an aliphatic carbon-carbon double bond, in a manner which is known for the addition of aliphatic carbon-carbon double bonds to Si-bonded hydrogen and, in a second stage, reacting the resultant compound having anhydride groups, which is obtained in the first stage, with a compound having the formula $$(H_2C=CR^2Y_x)_aR^3XH \qquad (II)$$

where $R^2$, $R^3$, X, Y, a and x are the same as above in a manner which is known for reacting carboxylic acid anhydride groups with a compound containing a Zerewitinoff-active hydrogen.

Examples of radicals represented by $R^5$, which form the $R^1$ radical have the following formulas: $-CH=CH_2$, $-CH_2CH=CH_2$, $-CH_2C(CH_3)=CH_2$ and o—, m— and p—$CH_2=CHC_6H_4$—where the aryl radical can be halogenated.

Allylsuccinic anhydride is preferably reacted in the first stage with the organopolysiloxane containing Si-bonded hydrogen.

The compound represented by formula (I) is preferably used in an amount of from 1 to 1.2 mols per gram-atom of Si-bonded hydrogen.

The first stage is preferably carried out in the presence of a catalyst, which promotes the addition of the aliphatic carbon-carbon double bond to Si-bonded hydrogen. An example of a suitable catalyst is $H_2PtCl_6 \cdot 6H_2O$.

Hydroxyethyl acrylate is the preferred compound (II) having the formula $$(H_2C=CR^2Y_x)_aR^3XH.$$

Other examples of compounds having the formula $$(H_2C=CR^2Y_x)_aR^3XH$$

are allyl alcohol, 1-pentene-5-ol, pentaerythritol trimethacrylate, trimethylolpropane dimethacrylate, hydroxyethylacrylamide, hydroxyethyl acrylic acid thioester, allylamine, allylthiol, thiopentaerythritol triacrylthiolate, aminopentaerythritol triacrylamide, 2-thioethyl allyl sulfide and 2-hydroxyethyl allyl sulfide.

Preferably, the compound represented by the formula (II) is used in an amount of from 1 to 1.2 mols per mol of the compound represented by formula (I).

The organopolysiloxanes of this invention can be prepared in a solvent which is inert with respect to the reactants and catalysts, such as toluene, tetrahydrofuran or dioxane, in a single vessel without first having to purify the product obtained in the first stage.

The method of this invention is preferably carried out at ambient pressure, that is, at 1020 hPa (abs.) or approximately 1020 hPa (abs.), and at 80° to 120° C. If desired, however, higher or lower pressures and higher or lower temperatures can also be used.

The solvent is preferably distilled off from the end product under reduced pressure.

The organopolysiloxanes having the formula $$A_xR_{3-x}SiO(SiR_{2-x}A_xO)_nSiR_{3-x}A_x$$

or $$(SiR_{2-x}A_xO)_y$$

can be equilibrated with other organopolysiloxanes, particularly organopolysiloxanes having the formulas $$HOR_2Si(SiR_2O)_nSiR_2OH \text{ or } (R_2SiO)_y$$

wherein R, n and y are the same as above.

The organopolysiloxanes of this invention are preferably crosslinked by ultraviolet light, preferably light having a wavelength in the range of from 200 to 400 nm (nanometers). The ultraviolet light can be produced, for example, by xenon lamps or low-pressure, medium-pressure or high-pressure mercury lamps. Light having a wavelength of from 400 to 600 nm, that is, the so-called "halogen light", is also suitable for photo-crosslinking.

When the organopolysiloxanes of this invention are photo-crosslinked, the organopolysiloxanes having the formulas $$A_xR_{3-x}SiO(SiR_{2-x}A_xO)_nSiR_{3-x}A_x \text{ or}$$
$$(SiR_{2-x}A_xO)_y,$$

where A, R, n, x and y are the same as above, are mixed with a photosensitizer. Examples of photosensitizers are anthraquinone and substituted anthraquinones such as the chloroanthraquinones, benzophenone and substituted benzophenones such as the hydroxybenzophenones, xanthone and substituted xanthones, acetophenone and substituted acetophenones, benzoin and substituted benzoins such as benzoin ether, thioxanthone and substituted thioxanthones, benzil and substituted benzils such as benzil ketals and fluorenone and substituted fluorenones. Examples of other photosensitizers are 2-hydroxy-2-methyl-1-phenylpropan-1-one, 2,4-bis(-trimethylsiloxy)benzophenone, trichlorobutylacetophenone, mesityl oxide, propiophenone, benzaldehyde, fluorene, carbazole, 3-methylacetophenone, 4-methylacetophenone, 3-bromoacetophenone, 4-methylbenzophenone, 4-chlorobenzophenone, 4,4'-dimethoxybenzophenone, 4-chloro-4'-benzylbenzophenone, 3-chloroxanthone, 3,9-dichloroxanthone, 3-chloro-8-nonylxanthone, Michler's ketone, cinnamic acid, benzoin methyl ether, anthraquinone-1,5-disulfonic acid disodium salt and 2-naphthalenesulfonyl chloride.

When the organopolysiloxanes of this invention are present in admixture with a photosensitizer, the amount of photosensitizer is preferably from 0.5 to 2 weight percent based on the weight of the organopolysiloxanes.

The organopolysiloxanes of this invention can also be crosslinked by energy-rich radiation other than the above-mentioned types of light, i.e., by X-rays, gamma rays or electron beams. Generally, from 1 to 4 mrads are sufficient for such other types of radiation.

The organopolysiloxanes of this invention may also be crosslinked in the presence of heat by means of radical-forming agents such as peroxides. When peroxides are used as radicalforming agents, the amount of peroxide preferably ranges from about 0.1 to 5 weight percent based on the weight of the organopolysiloxanes. The preferred temperature range for crosslinking with radical-forming agents is from 80° to 200° C. Examples of suitable peroxides are dicumyl peroxide, benzoyl peroxide, bis(2,4-dichlorobenzoyl)peroxide and peroxides containing organosilicon groups.

The organopolysiloxanes of this invention may be used as coatings or for embedding electronic components. These compositions may be applied to such surfaces as, for example, ceramic surfaces or glass, including glass fibers, as well as fiber optics; paper such as kraft paper or pergamyn and cardboard; including that made of asbestos; also wood; cork; plastics for example polyesk, polyacrylate or polycasbonate woven or nonwoven cloth made of natural or synthetic organic fibers; and metals such as steel or aluminum.

The organopolysiloxanes of this invention may be applied on the surfaces to be coated by known methods which are suitable for the preparation of coatings from liquid substances. These organopolysiloxanes may be applied, for example, by immersion, painting, casting, spraying, rolling on, printing (for example, by an offset gravure coater), doctoring or by wiping on the surfaces.

The organopolysiloxanes of this invention can be applied to the surfaces as a solvent solution or in the form of an aqueous emulsion. Preferably, however, solvents are not present in the coating compositions of this invention.

Examples of electronic components which can be embedded in the organopolysiloxanes of this invention are hybrid switching circuits, for example, for electronic ignitions, modules, photovoltaic solar generators and other semiconductor arrangements.

Of course, the organopolysiloxanes of this invention are preferably crosslinked by ultraviolet light when used for coatings or for embedding electronic components.

The organopolysiloxanes of this invention may be applied as coatings, such as, for example, as primers and as dirt- and water-repellent coatings. The organopolysiloxanes of this invention are also suitable as casting resins, as adhesives, as additives to other substances to improve the adhesion of such other substances on substrates and as binders for finely divided particulate solid substances such as sand or wood.

In the following examples, all percentages are by weight unless otherwise specified.

EXAMPLE 1

About 146.6 g of a dimethylpolysiloxane having a Si-bonded hydrogen atom in each terminal unit and having an average of 23 silicon atoms per molecule are mixed with $H_2PtCl_6.6H_2O$ and heated to 90° C. About 28 g of allylsuccinic anhydride in 50 g of toluene are added dropwise to this heated mixture with stirring. The amount of $H_2PtCl_6.6H_2O$ added to the dimethylpolysiloxane provides about 50 ppm (parts per million) by weight of platinum calculated as the element and based on the total weight of dimethylpolysiloxane and acid anhydride. Stirring is continued for 1 hour at 90° C. after the addition of the acid anhydride is complete.

About 22.6 g of 2-hydroxyethyl acrylate are added dropwise with stirring at 90° C. to the resultant liquid. After the addition of acrylate is complete, the mixture is heated to 100° C. and stirred at this temperature for two hours. Substances boiling up to 100° C. at 0.1 hPa (abs.) are then distilled off.

On the basis of $^1$H-NMR analysis, the Si-bonded hydrogen atoms of the initial organopolysiloxane are all replaced by a radical having the formula $H_2C=CHCOO(CH_2)_2OOCCH_2CH(COOH)(CH_2)_3-$ or

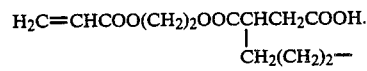

EXAMPLE 2

Samples of the organopolysiloxane prepared in accordance with the procedure described in Example 1 and containing carboxyl and acryloxy groups are mixed with 2 percent by weight of 2-hydroxy-2-methyl-1-phenylpropane-1-one and applied as a layer having a thickness which varies from 1 to 12 mm on small plates of aluminum, steel, porcelain, wood, and paper, and then irradiated with a mercury medium-pressure ultraviolet lamp having a power of 80 watts/cm illumination and a maximum power at 366 nm at a distance of 10 cm. Dry coatings are obtained having good adhesion to the substrates on which they are produced after being irradiated for from 1 to 8 seconds depending on the thickness of the layer.

EXAMPLE 3

About 286 g of a dimethylpolysiloxane having an Si-bonded hydroxyl group in each terminal unit and a viscosity of 100 mPa.s at 25° C. are mixed with 12.9 g of the organopolysiloxane having carboxyl and acryloxy groups prepared in accordance with the procedure of Example 1, 60 g of toluene and 200 ppm by weight of phosphonitrile chloride having the formula $Cl_3PNPCl_2NPCl_3.PCl_6$ and then heated at 100° C. for 1.5 hours. The resultant mixture is mixed with 0.1 ml of a 25 percent solution of 1,3-divinyl-1,1,3,3-tetramethyldisilazane in methylene chloride in order to deactivate the equilibration catalyst. After filtration, the components of the mixture boiling up to 80° C. at 0.1 hPa (abs.) are distilled off. A clear oil having a viscosity of 13,000 mPa.s at 25° C. is obtained.

EXAMPLE 4

The procedure described in Example 2 is repeated, except that the oil prepared in accordance with Example 3 having a viscosity of 13,000 mPa.s at 25° C. is substituted for the organopolysiloxane of Example 2. A dry elastomeric coating having good adhesion to the substrate is obtained after being irradiated for from 1 to 8 seconds, depending on the thickness of the layer.

EXAMPLE 5

The procedure described in Example 1 is repeated, except that 786 g of an organopolysiloxane having the formula $(CH_3)_3SiO[Si(CH_3)_2O]_{100}[Si(CH_3)HO]_5Si(CH_3)_3$ are substituted for the 146.6 g of the organopolysiloxane used in Example 1. About 70 g of allylsuccinic anhydride are substituted for the 28 g of allylsuccinic anhydride and 58 g of 2-hydroxyethyl acrylate are used instead of 22.6 g of 2-hydroxyethyl acrylate.

Based on $^1$H-NMR analysis, all Si-bonded hydrogen atoms in the starting organopolysiloxane are replaced by the same organic radicals shown in Example 1 having carboxyl and acryloxy groups.

EXAMPLE 6

The procedure described in Example 2 is repeated, except that the organopolysiloxane having carboxyl and acryloxy groups prepared in accordance with Example 5 is substituted for the organopolysiloxane of Example 2. Dry hard coatings having good adhesion on the substrates on which they are produced are obtained after being irradiated for from 1 to 8 seconds, depending on the thickness of the layer.

What is claimed is:

1. Crosslinkable organopolysiloxanes having the formula selected from the group consisting of $$A_xR_{3-x}SiO(SiR_{2-x}A_xO)_nSiR_{3-x}A_x$$

and $$(SiR_{2-x}A_xO)_y,$$

where R is selected from the group consisting of a monovalent hydrocarbon radical, a halogenated monovalent hydrocarbon radical and a monovalent aliphatic radical containing carbon, hydrogen, ether oxygen and fluorine atoms; A represents a SiC-bonded organic radical containing a carboxyl group and a carbonyl group to which is bonded an organic radical having at least one terminal carbon-carbon double bond; n is an integer having a value of at least 1; x is 0 or 1; and y is an integer having a value of from 3 to 10, in which the organopolysiloxanes contain at least one radical A per molecule.

2. The organopolysiloxane of claim 1, wherein the radical A is selected from the formula consisting of $$(H_2C{=}CR^2Y_x)_aR^3XC(CR_2{}^2)_mCR^2(COOH)R^1{-} \text{ and}$$
$$\overset{O}{\underset{\|}{}}$$

$$(H_2C{=}CR^2Y_x)_aR^3X\overset{O}{\underset{\|}{C}}CR^2(CR_2{}^2)_{m-1}COOH,$$
$$\underset{R^1}{|}$$

where $R^1$ is a divalent radical selected from the group consisting of a hydrocarbon radical and a halogenated hydrocarbon radical; $R^2$ is selected from the group consisting of hydrogen and a monovalent hydrocarbon radical which is free of aliphatic carbon-carbon multiple bonds and has from 1 to 10 carbon atoms per radical; $R^3$ is a hydrocarbon radical which is divalent when a is 1, trivalent when a is 2 and tetravalent when a is 3; X is selected from the group consisting of oxygen, sulfur and a radical having the formula $-NR^2-$, $R^2$ is the same as above and Y is selected from the formula consisting of $$-R^1O-$$

$$\overset{O}{\underset{\|}{-C O-}}$$

$$-R^1NR^2-$$

$$\overset{O}{\underset{\|}{-C NR^2-}}$$

$$\overset{O}{\underset{\|}{-C S-}} \text{ and}$$

$$-SR^1-,$$

$R^1$ and $R^2$ are the same as above; a is 1, 2 or 3 and m is an integer having a value of from 1 to 6 and x is 0 or 1.

3. The organopolysiloxane of claim 1, wherein A is a radical selected from the group consisting of $$H_2C{=}CHCOO(CH_2)_2OOCCH_2CH(COOH)(CH_2)_3{-}$$

and $$H_2C{=}CHCOO(CH_2)_2OOCCHCH_2COOH.$$
$$\underset{CH_2(CH_2)_2{-}}{|}$$

4. A method for preparing the crosslinkable organopolysiloxanes of claim 1, which comprises reacting in a first stage, an organopolysiloxane selected from the group consisting of $$H_xR_{3-x}SiO(SiR_{2-x}H_xO)_nSiR_{3-x}H_x \text{ and}$$
$$(SiR_{2-x}H_xO)_y$$

with dicarboxylic acid anhydride having the formula

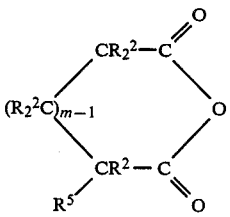   (I)

where R is selected from the group consisting of a monovalent hydrocarbon radical, a halogenated monovalent hydrocarbon radical and a monovalent aliphatic radical containing carbon, hydrogen, ether oxygen and fluorine atoms; $R^2$ is selected from the group consisting of hydrogen and a monovalent hydrocarbon radical which is free of aliphatic carbon-carbon multiple bonds and has from 1 to 10 carbon atoms per radical; $R^5$ is selected from the group consisting of a monovalent hydrocarbon radical containing an aliphatic carbon-carbon double bond and a halogenated monovalent hydrocarbon radical containing an aliphatic carbon-carbon double bond; m is an integer having a value of from 1 to 6 and x is 0 or 1 and then, in a second stage, reacting the compound obtained in the first stage with a compound having the formula $$(H_2C{=}CR^2Y_x)_aR^3XH \quad (II)$$

where $R^2$ is the same as above; $R^3$ is a hydrocarbon radical which is divalent when a is 1, trivalent when a is 2 and tetravalent when a is 3; X is selected from the group consisting of oxygen, sulfur and a radical having the formula $-NR^2-$, $R^2$ is the same as above and Y is selected from the formula consisting of $$-R^1O-$$

$$\overset{O}{\underset{\|}{-C O-}}$$

$$-R^1NR^2-$$

$$\overset{O}{\underset{\|}{-C NR^2-}}$$

$$\overset{O}{\underset{\|}{-C S-}} \text{ and}$$

-continued

—SR$^1$—,

R$^1$ and R$^2$ are the same as above; a is 1, 2 or 3 and x is 0 or 1.

5. The method of claim 4, wherein the dicarboxylic acid anhydride is allylsuccinic anhydride.

6. The method of claim 4, wherein the compound of formula II is hydroxyethyl acrylate.

7. The crosslinkable organopolysiloxanes of claim 1, wherein the organopolysiloxanes are mixed with a photosensitizer.

8. The crosslinkable organopolysiloxanes of claim 2, wherein the organopolysiloxanes are mixed with a photosensitizer.

9. The crosslinkable organopolysiloxanes of claim 3, wherein the organopolysiloxanes are mixed with a photosensitizer.

10. The crosslinkable organopolysiloxanes of claim 1, wherein the organopolysiloxanes are mixed with a peroxide.

11. The crosslinkable organopolysiloxanes of claim 2, wherein the organopolysiloxanes are mixed with a peroxide.

12. The crosslinkable organopolysiloxanes of claim 3, wherein the organopolysiloxanes are mixed with a peroxide.

13. A method for coating a substrate which comprises applying the crosslinkable organopolysiloxanes of claim 7 to the substrate and thereafter exposing the organopolysiloxanes to a radiation source.

14. The method of claim 13, wherein the crosslinkable organopolysiloxanes of claim 8 are applied to the substrate and then exposed to a radiation source.

15. The method of claim 13, wherein the crosslinkable organopolysiloxanes of claim 9 are applied to the substrate and then exposed to a radiation source.

16. A method for coating a substrate which comprises applying the crosslinkable organopolysiloxanes of claim 10 to the substrate and then heating the organopolysiloxanes to a temperature which is sufficient to promote crosslinking.

17. The method of claim 16, wherein the crosslinkable organopolysiloxanes of claim 11 are applied to the substrate and then heated to a temperature sufficient to promote crosslinking.

18. The method of claim 16, wherein the crosslinkable organopolysiloxanes of claim 12 are applied to the substrate and then heated to a temperature sufficient to promote crosslinking.

* * * * *